United States Patent [19]
Mehdizadeh et al.

[11] Patent Number: 5,144,240
[45] Date of Patent: Sep. 1, 1992

[54] NMR SPECTROSCOPY AND IMAGING COIL

[75] Inventors: Mehrdad Mehdizadeh, Wilmington, Del.; David A. Lampman, Lakewood; Paul T. Orlando, Mentor, both of Ohio

[73] Assignee: Picker International, Inc., Highland Hts., Ohio

[21] Appl. No.: 651,306

[22] Filed: Feb. 6, 1991

Related U.S. Application Data

[63] Continuation-in-part of Ser. No. 392,653, Aug. 11, 1989, Pat. No. 5,045,792, which is a continuation-in-part of Ser. No. 234,278, Aug. 19, 1988, Pat. No. 4,918,388, and Ser. No. 199,202, May 26, 1988, Pat. No. 4,879,516, which is a continuation-in-part of Ser. No. 120,475, Nov. 13, 1987, Pat. No. 4,839,594, and Ser. No. 86,277, Aug. 17, 1987, Pat. No. 4,841,248, said Ser. No. 120,475, is a continuation-in-part of Ser. No. 931,726, Nov. 17, 1986, Pat. No. 4,752,738, and Ser. No. 765,708, Aug. 14, 1985, Pat. No. 4,793,356, said Ser. No. 86,277, is a continuation-in-part of Ser. No. 931,726, , and Ser. No. 765,708.

[51] Int. Cl.[5] ............................................. G01R 33/20
[52] U.S. Cl. ..................................... 324/318; 324/322
[58] Field of Search ............... 324/300, 307, 308, 309, 324/310, 311, 312, 313, 314, 318, 322; 128/653 SC

[56] References Cited

U.S. PATENT DOCUMENTS

| | | | |
|---|---|---|---|
| 4,691,163 | 9/1987 | Blass et al. | 324/318 |
| 4,742,304 | 5/1988 | Schnall et al. | 324/318 |
| 4,751,464 | 6/1988 | Bridges | 324/318 |
| 4,799,016 | 1/1989 | Rezvani | 324/318 |
| 4,855,412 | 5/1989 | Zens | 324/322 |
| 4,857,846 | 8/1989 | Carlson | 324/309 |
| 4,885,539 | 12/1989 | Roemer et al. | 324/318 |
| 4,931,734 | 6/1990 | Kemner et al. | 324/318 |
| 5,053,711 | 10/1991 | Hayes et al. | 324/318 |
| 5,075,624 | 12/1991 | Bezjak | 324/318 |

OTHER PUBLICATIONS

Design and Evaluation of a Double Tuned ($^1$H,[31]P) Birdcage Head Coil for Use in Clinical Imaging and Spectroscopy at 1.5T, Isaac, et al.
A Double-Tuned Birdcage Coil, Rath.
A Double-Frequency Head Coil, Prammer and Leigh.
Optimal Decoupling of Multiple-Tuned Receiver Coils, Prammer, et al.
A Simple Double-Resonance Probe Design Suitable for Head Imaging and Spectroscopy at 2.35 Tesla, Boesch, et al.

Primary Examiner—Michael J. Tokar
Attorney, Agent, or Firm—Fay, Sharpe, Beall, Fagan, Minnich & McKee

[57] ABSTRACT

In a magnetic resonance imaging apparatus, a first frequency radio signal source (20a) is connected in quadrature with a four fold symmetric birdcage coil (24) at 90° spaced connection points (80a,b). A source of a second radio frequency signal is directly connected with the birdcage coil by first and second inductive couplings (70a,b). The birdcage coil includes tank circuits (52) and capacitors (58, 60) in the end connectors. The capacitance of the end connectors is simultaneously adjustable by a tuning ring (62) to adjust a first resonance frequency of the coil and the capacitance of the tank circuits is selectively adjustable to adjust a second resonant frequency of the birdcage coil. In this manner, the birdcage coil is simultaneously tuned to two frequencies and can operate in quadrature at either one. PIN diodes (92) are provided for de-tuning the coil such that it operates in a third mode in which no resonance frequency exists such that the birdcage coil does not interfere with reception of resonance signals by a surface coil (42). When operating in quadrature, additional PIN diodes (114) are provided for connecting the RF feed point to one node (102a) of a 90° phase shift circuit (100) in the transmit mode and to the opposite node (102b) of the 90° phase shift circuit in the receive mode.

22 Claims, 6 Drawing Sheets

NMR SPECTROSCOPY AND IMAGING COIL

The present invention is a continuation-in-part of U.S. application Ser. No. 392,653, filed Aug. 11, 1989, now U.S. Pat. No. 5,045,792 which is a continuation-in-part of prior pending U.S. application Ser. No. 234,278, filed Aug. 19, 1988, now U.S. Pat. No. 4,918,388, and application Ser. No. 199,202, filed May 26, 1988, now U.S. Pat. No. 4,879,516, which is in turn a continuation-in-part of pending U.S. application Ser. No. 120,475, filed Nov. 13, 1987, now U.S. Pat. No. 4,839,594; application Ser. No. 086,277, filed Aug. 17, 1987, now U.S. Patent No. 4,841,248; which are continuations-in-part of application Ser. No. 931,726, filed Nov. 17, 1986, now U.S. Pat. No. 4,752,738, and application Ser. No. 765,708, filed Aug. 14, 1985, now U.S. Pat. No. 4,793,356.

The present invention relates to the magnetic resonance arts. It finds particular application in conjunction with the contemporaneous imaging or spectroscopic analysis of hydrogen and phosphorous nuclei and will be described with particular reference thereto. However, it is to be appreciated that the invention is also applicable to other multiple nuclei imaging and spectroscopy applications.

Heretofore, others have recognized that it would be advantageous to acquire proton magnetic resonance images and/or spectra concurrently with phosphorus (P31) images and/or spectra. Conventionally, the radio frequency transmission and reception coils of the magnetic resonance scanner are tuned to the resonance frequency of the nuclei to be imaged. The resonance frequency is proportional to the product of the gyromagnetic ratio of the nuclei and the strength of the magnetic field. In conventional magnetic resonance imaging equipment, the strength of the magnetic field is fixed. Because the gyromagnetic ratios of hydrogen and phosphorous are very different, they have distinctly different resonance frequencies. In a one and a half tesla magnetic field, for example, the resonance or Larmor frequency of phosphorous is about 26 MHz as opposed to 64 MHz for hydrogen.

One prior art approach was to conduct the resonance experiment with a first coil tuned to the resonance frequency of hydrogen. The hydrogen tuned resonance coil was physically removed and replaced with a phosphorous tuned resonance coil. Not only was the change of coils slow and labor-intensive, but the resultant images or spectroscopic data were difficult to align. With human patients, the subject tended to move during the coil replacement process creating further problems in determining a correspondence between phosphorous and hydrogen images.

Another approach is to use the same coil for both the hydrogen and phosphorous images. Rather than changing coils, the coil is retuned between the collection of hydrogen and phosphorous data. This is again a relatively slow and labor-intensive process during which human patients are apt to move.

U.S. Pat. No. 4,799,016 issued January 1989 to Rezvani illustrates a coil arrangement in which two concentric coils are used orthogonal to each other. By placing the coils orthogonal to each other, each coil is invisible to the other during their independent operation. One of the drawbacks of the Rezvani design is that it is not amenable to quadrature applications. Redesigning each coil to operate in a quadrature mode, i.e. a mode in which the coil is sensitive to signals from two orthogonal directions, would cause the coils to interfere with each other.

Another approach is illustrated in the article "Design and Evaluation of Double Tuned ($^1$H,$^{31}$P) Birdcage Head Coil for Use in Clinical Imaging and Spectroscopy at 1.5T", G. Isaac, et al. SMRM Book of Abstracts, page 180 (1989). This abstract discloses a double tuned birdcage coil that works in a low pass configuration at the resonance frequencies of both hydrogen and phosphorus. Operating in the low pass configuration for phosphorus is disadvantageous. The high RF transmit voltages required create such high voltages across the capacitors that arcing would result when kilowatt level pulses are used. Another disadvantage of the Isaac coil is that the two resonance frequencies cannot be tuned separately. Accordingly, set-up and calibration is extremely complex.

Another double tuned birdcage coil is illustrated in "A Double Resonance Birdcage Coil for Imaging of Fluorine and Protons", Joseph, et al. SMRM Book of Abstracts, page 263 (1988). However, the Joseph design is only suitable when the two resonance frequencies are close to one another, e.g. within 10%, as with fluorine and hydrogen.

In accordance with the present invention, a new and improved double tuned resonance coil is provided that overcomes the above-referenced problems and others.

SUMMARY OF THE INVENTION

In accordance with one aspect of the present invention, a double tuned birdcage type coil is provided which operates as a high pass coil at the frequency with the higher transmit power and as a low pass coil for the other frequency.

In accordance with another aspect of the present invention, a double frequency birdcage type coil is provided which includes separate means for adjusting each of two resonance frequencies.

In accordance with yet another aspect of the present invention, a double tuned birdcage type coil is provided which has a third operating mode. Specifically, means are provided for deresonating the coil in order to decouple the coil from both frequencies when a separate receive coil is used.

In accordance with yet another aspect of the present invention, a double tuned birdcage coil is provided which operates in a quadrature mode for both frequencies.

In accordance with yet another aspect of the present invention, a coupling arrangement is provided for double tuned birdcage coils. The coupling arrangement provides for the direct coupling in one mode of operation and for flux linkage inductive coupling in the other.

In accordance with yet another aspect of the present invention, the coupling circuity includes a tank circuit to prevent coupling in one mode to interfere with operation and symmetry of the coil in the other mode.

In accordance with yet another aspect of the present invention, a PIN diode combiner/divider circuit is provided which reduces the number of cables attached to the coil.

One advantage of the present invention is that the birdcage coil is simultaneously tuned to two frequencies.

Another advantage of the present invention is that the coil operates in quadrature, i.e. circularly polarized in one or both modes.

Another advantage of the present invention is that it is readily decoupled from both frequencies during a receive period.

Another advantage of the present invention is that is simplifies fine tuning. The coil does not need to be retuned for each patient due to its distributed capacitance design. Moreover, both frequencies of the coil can be tuned independently without interfering with each other.

Another advantage of the present invention is that it can receive high power input pulses for manipulating the resonance of nuclei with small gyromagnetic ratios.

Still further advantages of the present invention will become apparent to those of ordinary skill in the art upon reading and understanding the following detailed description.

BRIEF DESCRIPTION OF THE DRAWINGS

The invention may take form in various components and arrangements of components and in various steps and arrangements of steps. The drawings are only for purposes of illustrating a preferred embodiment and are not to be construed as limiting the invention

DETAILED DESCRIPTION OF THE PREFERRED EMBODIMENTS

Figure 1:
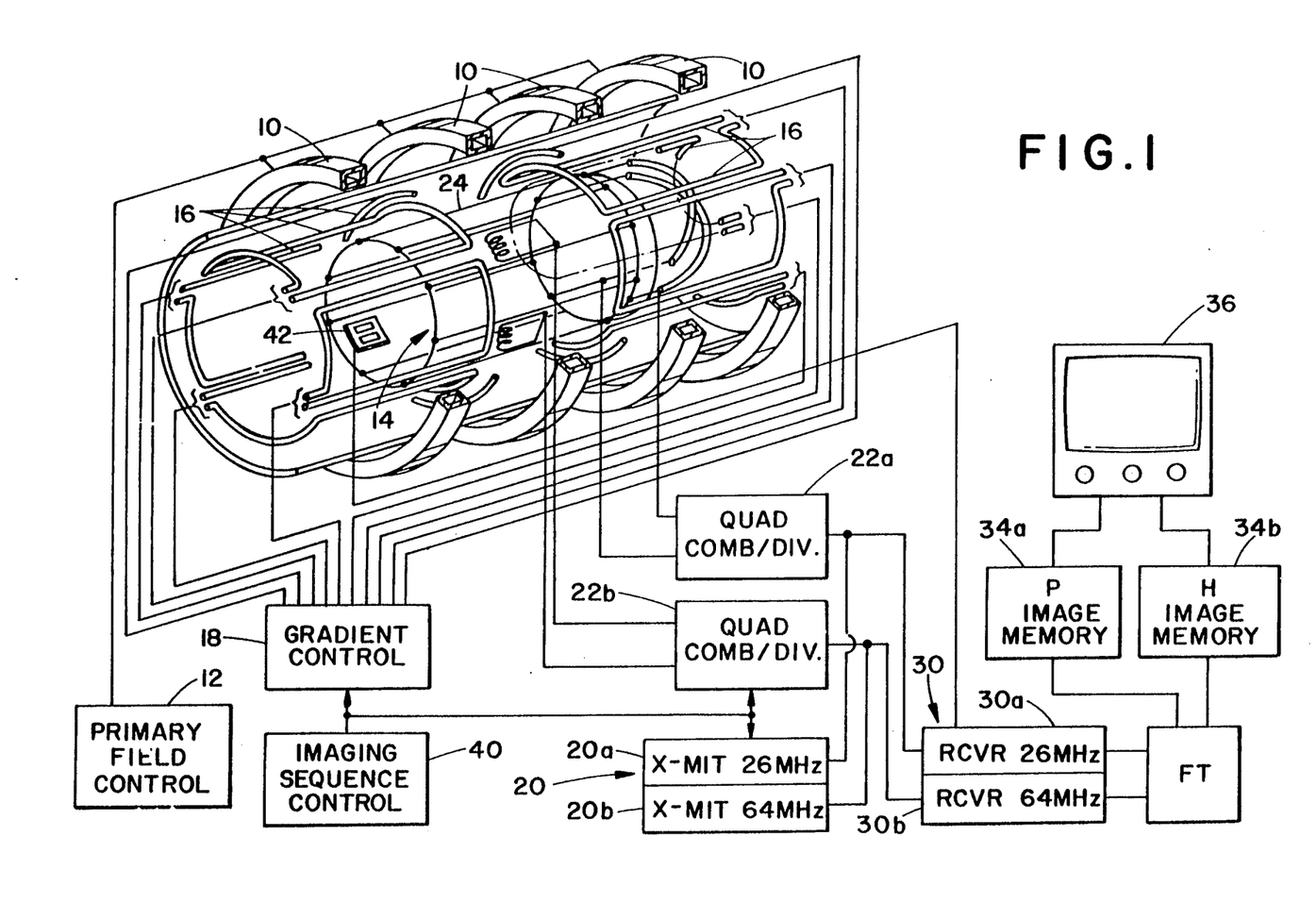
FIG. 1 is a diagrammatic illustration of a magnetic resonance imaging apparatus in accordance with the present invention.

Primary magnetic field coils 10 under the control of a primary magnetic field control means 12 create a static, uniform magnetic field longitudinally through an examination region 14. Gradient magnetic field coils 16 under the control of a gradient magnetic field control 18 selectively cause magnetic field gradients along and across the primary magnetic field.

A radio frequency transmitter means 20 selectively transmits pulses of radio frequency energy at selectable frequencies. In the preferred embodiment, the radio frequency transmitter means includes a transmitter means 20a for transmitting RF pulses at the resonance frequency of a first nucleus and a second frequency transmitter means 20b for transmitting RF pulses at the resonance frequency of a second nucleus. In the preferred embodiment, the RF frequencies are 26 MHz and 64 MHz—the resonance frequencies of phosphorous and hydrogen, respectively, in a 1.5 T magnetic field. The RF pulses are conveyed to corresponding upper and lower RF frequency quad combiner/divider circuits 22a, 22b. The quad divider circuits circularly polarize the RF pulses by providing two 90° phase shifted components, e.g. sine and cosine components which are applied 90° apart to a double tuned or dual frequency radio frequency birdcage coil 24.

When the birdcage coil 24 receives 26 MHz signals, it is tuned such that it operates in a high pass mode in which it is resonant at 26 MHz. When the birdcage coil receives 64 MHz signals, it operates in a low pass mode in which it is resonant at 64 MHz. In the receive mode, the quad combiner/dividers combine the quadrature components of the selected 26 or 64 MHz signal. The recombined and phase shifted signals are supplied to a receiving means 30 including a 26 MHz receiver 30a and a 64 MHz receiver 30b. The receivers include mixers of the appropriate frequencies to separate the carrier and resonance signals and supply appropriate data lines to a reconstruction means 32 for reconstructing images or spectra from the data line, such as a two dimensional inverse Fourier transform reconstruction means for reconstructing images. Reconstructed image or spectra representations are stored in a data memory means 34. Preferably, the data memory means includes a first nuclei or phosphorous memory means 34a and a second nuclei or hydrogen memory means 34b for storing corresponding phosphorous and hydrogen images or spectra. A display monitor 36 displays the corresponding phosphorous and hydrogen images and/or spectra side by side, superimposed, superimposed in different colors, or the like, as the operator may select.

The gradient control means 18, the radio frequency transmitter 20, and the quad combiner/divider means 22 are controlled by a sequence control means 40 to implement spin echo, gradient echo, and other conventional imaging sequences and to select which nucleus is to be imaged. In one preferred embodiment, phosphorous and hydrogen data are collected alternately to generate hydrogen and phosphorous images or spectra. Alternately, a surface coil 42 may be placed adjacent a region of interest of the subject for receiving the generated magnetic resonance signals. When the surface coil is utilized, the sequence control means 40 causes the birdcage coil 24 to enter a third, de-tuned mode in which no resonant frequency exists.

Figure 2:
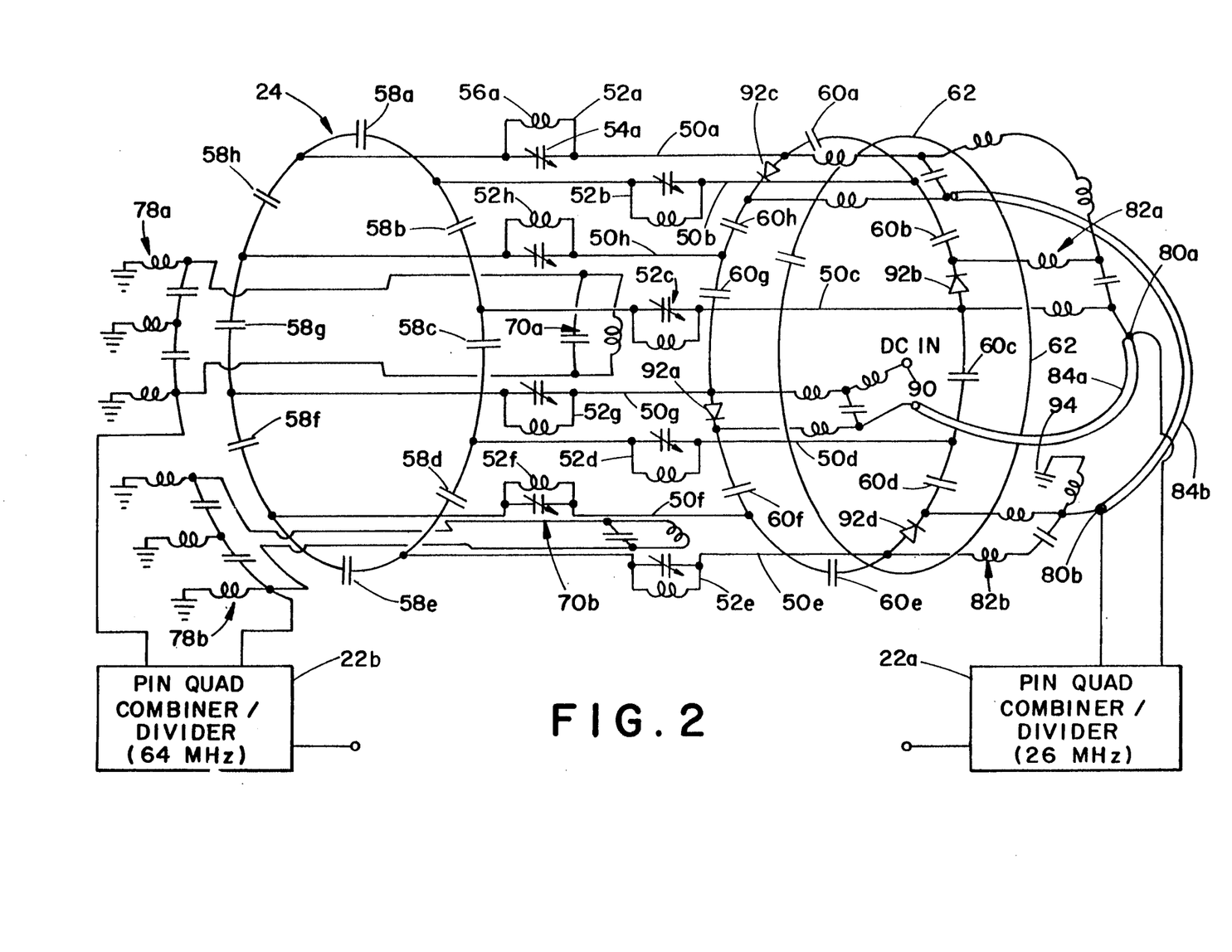
FIG. 2 is an enlarged, more detailed view of the birdcage RF coil of the magnetic resonance imager of FIG. 1.
Figure 3:
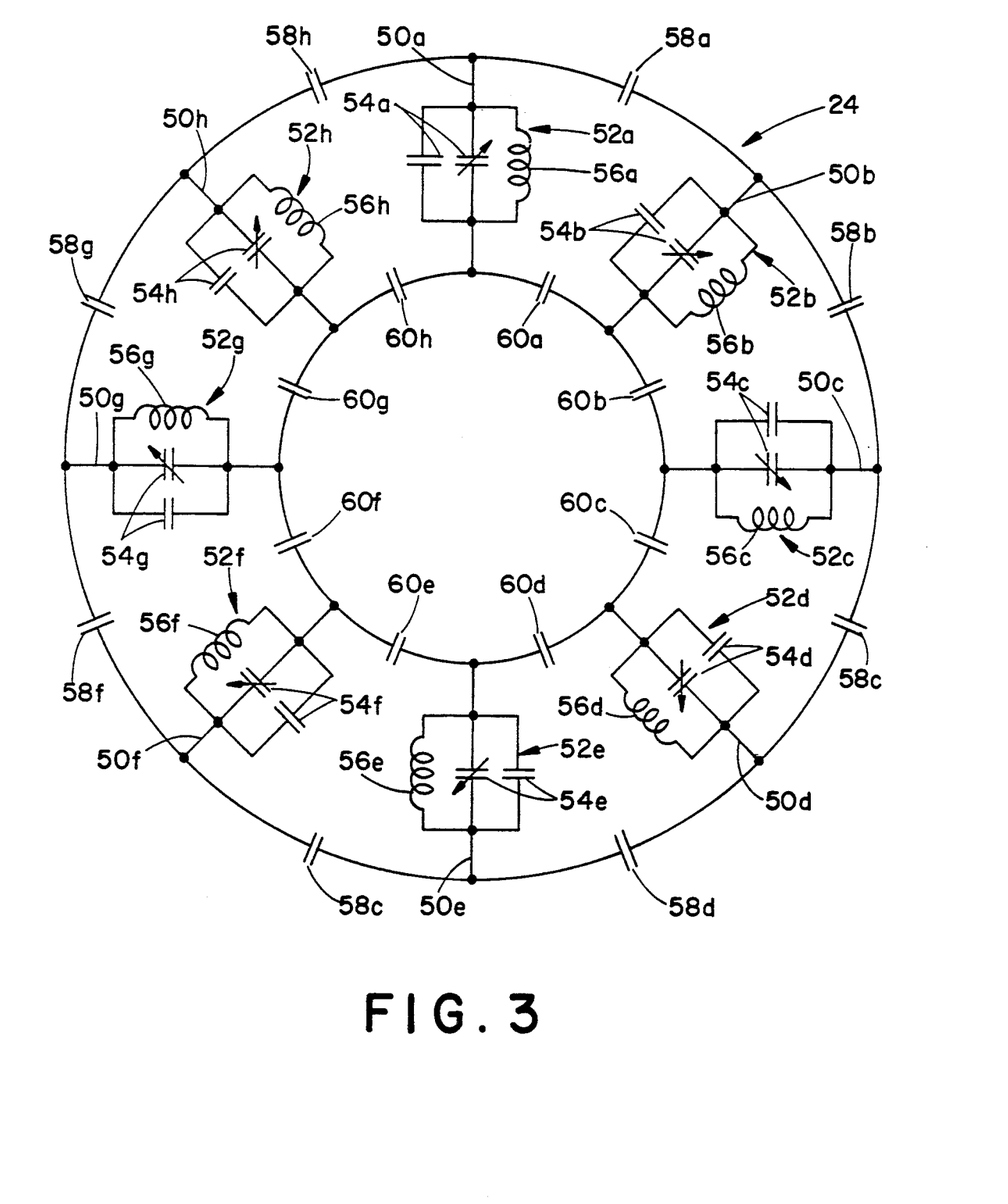
FIG. 3 is an electrical schematic diagram of the coil of FIG. 2.

With reference to FIGS. 2 and 3, the RF coil is a birdcage type coil with four fold symmetry. The coil includes 8 main or longitudinal conductors 50a-h, although other multiples of four are also contemplated. Each conductor includes a tank circuit 52a-h which is resonant at a frequency between the resonant frequencies of the two nuclei to be examined, i.e. between 26 and 64 MHz for phosphorous and hydrogen. Each tank circuit includes a parallel connected capacitance 54a-h and inductance 56a-h. Additional capacitors 58a-h interconnect the main conductors 50 in a loop at one end and capacitors 60a-h interconnect the main conductors in a loop adjacent to their other end. A fine tuning ring 62 is mounted adjacent each of conductors containing capacitors 60a-h. By adjusting the physical displacement between the fine tuning ring and the capacitors 60a-h, the capacitance of capacitors 60a-h are selectively adjusted or fine tuned. The tank circuits 52a-h and the capacitors 54a-h and 60a-h are selected to have values such that the coil resonates at the two selected resonance frequencies, e.g. 26 and 64 MHz.

Small variations in the capacitance of the capacitors 54a-h are primarily responsible for the fine tuning of the 64 MHz resonance frequency; whereas, adjustment of the capacitances 60a-h is primarily responsible for fine tuning the 26 MHz resonance frequency. In this manner, the two resonance frequencies are independently fine tunable.

Figure 4:
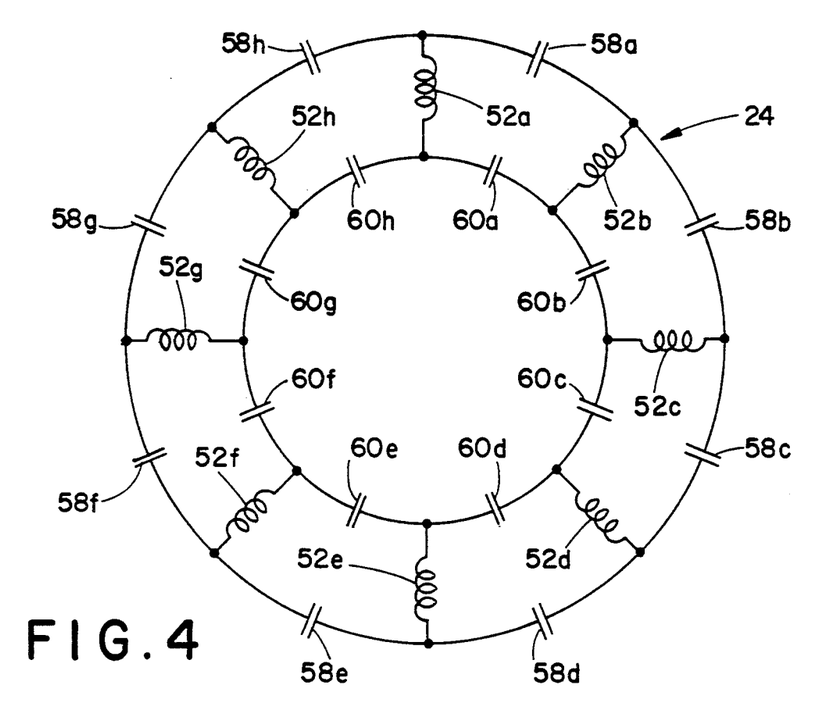
FIG. 4 is an equivalent circuit of the circuit of FIG. 3 when the coil operates in the high pass mode.
Figure 5:
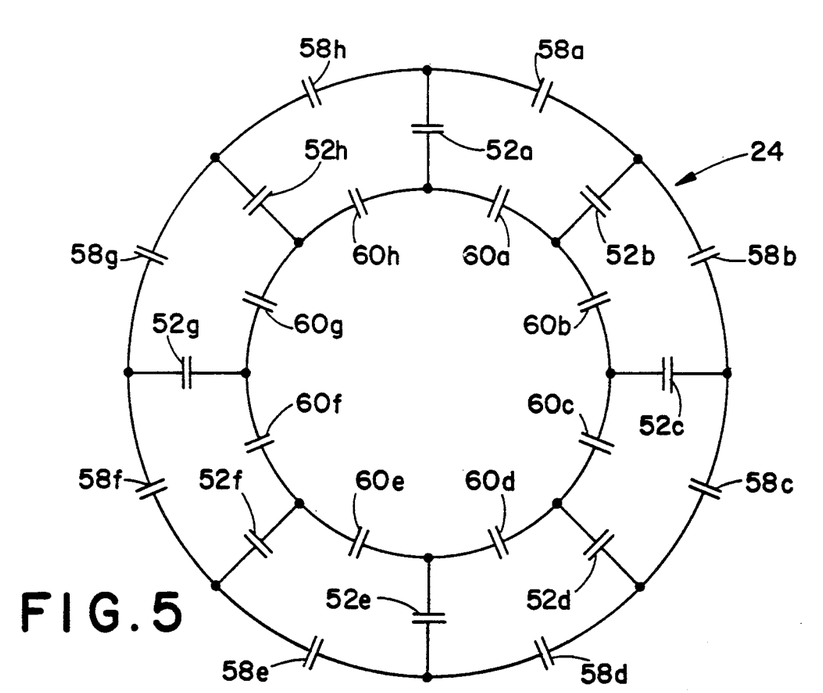
FIG. 5 is an equivalent circuit to the circuit of FIG. 3 when the coil operates in the low pass mode.

With continued reference to FIGS. 2 and 3, and further reference to FIG. 4, in the 26 MHz mode, the tank circuits have an inductive reactance. The inductance which each tank circuit has can be determined by mathematical calculation or by replacing each tank circuit with an adjustable inductance which is adjusted until the coil becomes resonant at the selected resonance frequency, e.g. 26 MHz. In the coil of the preferred embodiment, the reactance was found to be about 200 nH. With reference to FIG. 5, the inductors are removed and replaced with capacitors which are adjusted until the coil is resonant at 64 MHz. In the preferred embodiment, capacitors of 15 pF cause the desired 64 MHz resonance. Tank circuits are now inserted having a capacitance and an inductance which are calculated mathematically such that the tuning circuit has an inductive reactance equivalent to 200 nH at 26 MHz and a capacitive reactance equivalent to 15 pF at 64 MHz. Capacitances of 55 pF and inductors of 154 nH meet this criteria. One of the capacitors in the tank circuits, the capacitors 54 in the preferred embodiment, are adjustable to enable the coil to be fine tuned. Note that changing the variation in the capacitors 54 of the tank circuit does not effect the 26 MHz tuning. Conversely, it should be noted that adjusting the capacitance of capacitors 60 does not effect the 64 MHz tuning.

Normally, a higher RF transmit power is required to resonate phosphorus nuclei. At 26 MHz, the birdcage coil resonates in a high pass mode in which sixteen capacitors 58a-h and 60a-h divide the total applied voltage. Because the applied voltage is divided sixteen ways, the relative voltage across any one capacitor is relatively low, preventing arcing.

Figure 6:
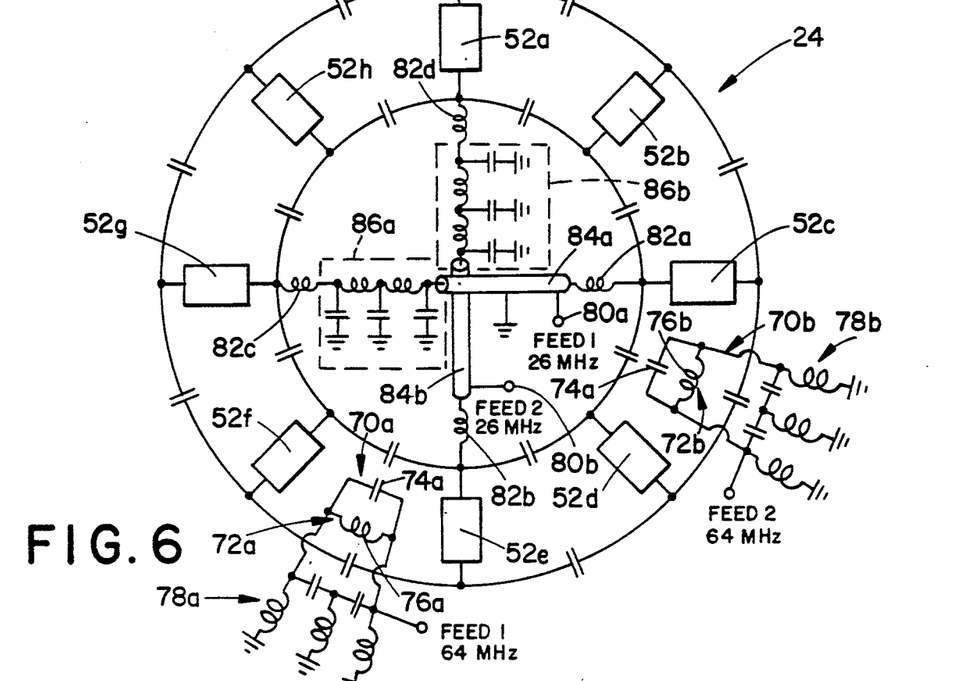
FIG. 6 is an equivalent circuit to the coil of FIG. 3 illustrating the quadrature coupling.

With reference again to FIG. 2 and further reference to FIG. 6, coupling means are provided for coupling the RF coil with the quad combiner/divider circuits 22 in both modes. The two couplings are effected in such a manner that an impedance of about 50 Ohms is seen at the input and such that coupling in one mode does not disturb the other mode. Interference between the coupling of the modes could cause a drop in the orthogonality of the quadrature mode or cause de-tuning. In the 64 MHz mode, an inductive coupling means is provided. The inductive coupling means includes a pair of identical coupling loops 70a, 70b connected 90° offset around the RF coil. The coupling loops are partially resonated by tank circuits 72a, 72b that include parallel connected capacitors 74a, 74b and inductors 76a, 76b. The tank circuit is designed to have a capacitive reactance at 64 MHz, but to have a high impedance at 26 MHz such that substantially no 26 MHz RF current flows into the loop. In this manner, interference of the 26 and 64 MHz modes is prevented. The high impedance at 26 MHz is achieved by adjusting the tank circuits such that they are resonant at 26 MHz. A pair of lumped-element baluns 78a, 78b provide for balanced operation. If the coil is to be operated in a linear rather than a quadrature mode at 64 MHz, one of the 64 MHz coupling loops is simply eliminated. The invention is intended to include variations such that linear or quad operation at one or both frequencies and any combination thereof is also included.

In the 26 MHz mode, a direct, inductive coupling is utilized. Two 26 MHz feed points 80a, 80b are connected by inductors 82a, 82b with two, 90° displaced portions of the RF coil. A pair of 180° baluns 84a, 84b extend from the feed points to partially lumped and partially distributed baluns 86a, 86b and are connected by inductors 82i c, 82d with 180° opposite points on the birdcage coil 24. The inductors 82a-d are selected to provide a large impedance at 64 MHz. A typical value used for these inductors is 1.3 μH. The partially lumped and partially distributed baluns provide phase shift of 180°. In this manner, the 64 MHz mode is isolated from the 26 MHz mode.

Figure 7:
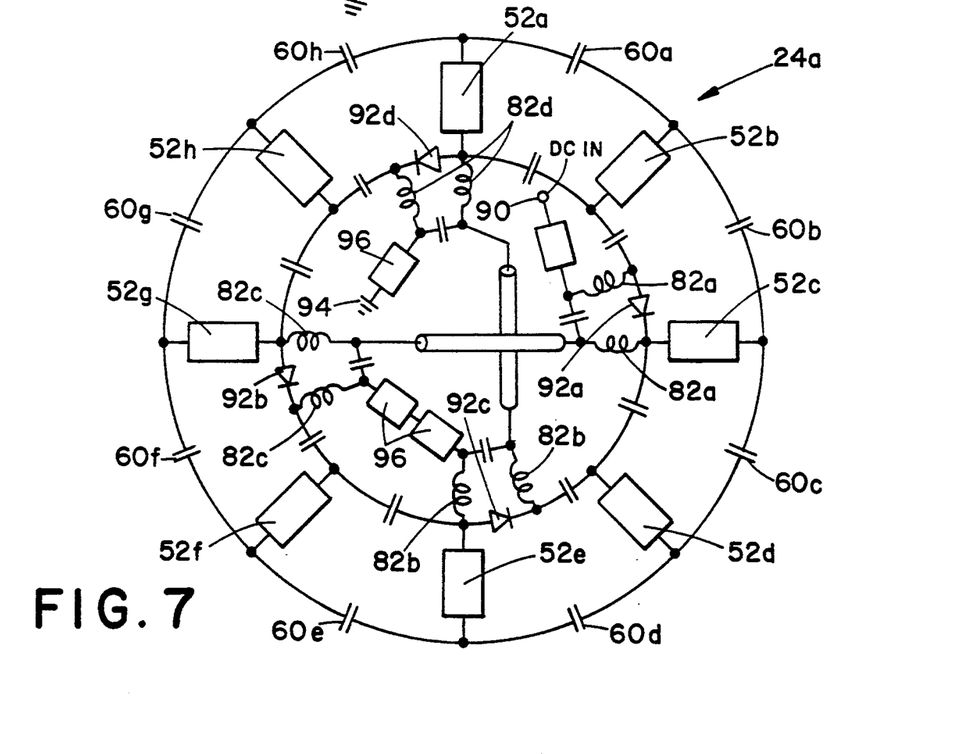
FIG. 7 is an equivalent circuit of the coil of FIG. 2 including appropriate leads and components for decoupling the coil.

With continuing reference to FIG. 2 and particular reference to FIG. 7, it is frequently desirable to use a surface coil to receive the spectroscopy signal while using the RF coil only as a transmitter. In this instance, the RF coil is de-tuned during the receive period to prevent the surface coil from being de-tuned. A DC signal is applied at de-tune feed point 90. Of course, to the DC current, inductors appear as short circuits and the capacitors appear as open circuits. The DC current flows through the inductors 82 and baluns 84, 86 of the 26 MHz feed circuit flowing through each of PIN diodes 92a-d to bias the diodes conductive. Note that the DC signal flows through one of parallel connected inductor elements of inductor 82a, through PIN diode 92a, back through the other parallel connected inductor element of inductor 82a, through the balun 84a, through one parallel connected portion of inductor 82c, through PIN diode 92b, and back through a second parallel connected inductive portion of inductor 82c, etc. The same principle carries the DC current through each of the PIN diodes to a ground 94. RF radio frequency chokes 96 are provided for preventing interference with the 26 or 64 MHz modes.

Figure 8:
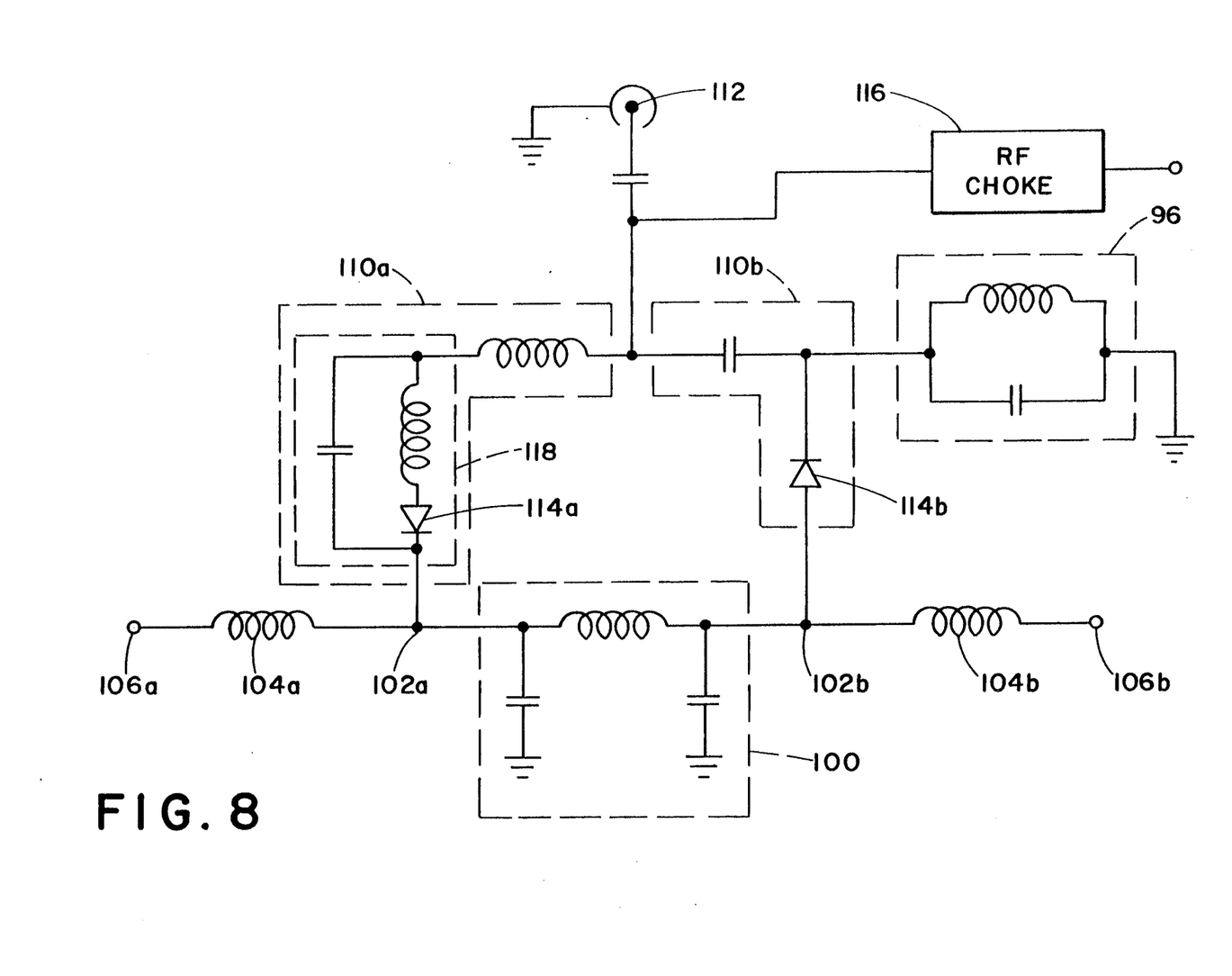
FIG. 8 is a block diagram of the combiner/divider of FIG. 1.

With reference to FIG. 8, the quadrature divider/combiner includes a $\pi$ network 100 which causes a 90° phase shift. The $\pi$ network is connected with summing nodes 102a, 102b which are connected by like inductors 104a, 104b with feed points 106a, 106b to the birdcage coil coupling means. An RF signal applied to one of the nodes 102a is communicated to one feed point 106a with no phase shift and to the other feed point 106b 90° lagging. When components of an RF signal are received at feed points 106a and 106b, one component is phase shifted by the $\pi$ network and summed with the unshifted component at one of the summing nodes. One can select which received component leads and which one lags by selecting which summing node to monitor.

A pair of feed paths 110a, 110b are connected with the summing nodes 102a, 102b at opposite ends of the $\pi$ network and with a common input/output point 112. The paths 110a, 110b include a pair of PIN diodes 114a, 114b. In the transmit mode, PIN diodes 114a and 114b are biased on by means of a DC bias current applied through a radio frequency choke 116. A tank circuit 118 tuned to the resonance frequency then provides a high impedance thereby connecting the input/output point 112 with one of the summing nodes 102b. In the receive mode, the DC bias current is removed and PIN diodes 114a and 114b are biased off becoming high impedance open circuits blocking RF current flow getting to summing node 102b. In this manner, the RF signal applied to one summing junction 102b in the transmit mode has a leading component transmitted directly to one feed point 106b and a lagging component transmitted to the other feed point 106a. In the receive mode, the RF component received at the feed point 106b is phase shifted 90° by the $\pi$ circuit 100 to be the lagging component and is summed with the unphase shifted or leading component from the other feed point 106a at summing node 102a. Thus, which feed point carries the leading component and which carries the lagging component is reversed in the transmit and receive modes.

With reference to FIG. 7, when a surface coil is used, a negative DC bias is applied to the PIN diodes 92a, 92b, 92c, 92d and an isolation circuit 96 to ground to detune the birdcage resonance structure. The isolation circuit 96 includes a tank circuit that is resonant at the resonant frequency being applied and received such that transmitted and received signals, are not lost to ground. An analogous combiner/divider circuit is provided for the hydrogen mode, but with the capacitive and inductive values adjusted for resonance at 64 MHz.

The invention has been described with reference to the preferred embodiments. Of course, modifications and alterations will occur to others upon reading and understanding the preceding detailed description. It is intended that the invention be construed as including all such alterations and modifications insofar as they come within the scope of the appended claims or the equivalents thereof.

Having thus described the preferred embodiment, the invention is now claimed to be:

1. A magnetic resonance imaging apparatus comprising:
   a means for creating a primary magnetic field through an examination region;
   a gradient field means for selectively causing magnetic field gradients across the primary magnetic field;
   a first radio frequency means for supplying radio frequency resonance excitation and manipulation signals of a first frequency;
   a second radio frequency means for supplying radio frequency resonance excitation and manipulation signals of a second frequency;
   a radio frequency coil which is concurrently tuned to both the first and second frequencies for selectively exciting magnetic resonance of nuclei in the examination region which are excited to resonance at the first and second frequencies;
   a first coupling means for selectively coupling the first radio frequency means with the radio frequency coil;
   a second coupling means for selectively coupling the second radio frequency means with the radio frequency coil;
   a reconstruction means for reconstructing magnetic resonance signals emanating from the examination region into an electronic representation of nuclei which resonate at the first frequency and into an electronic representation of nuclei which resonate at the second frequency;
   a first memory means for selectively storing representations of the nuclei which resonate at the first frequency;
   a second memory means for storing the representations of nuclei that resonate at the second frequency; and,
   means for displaying the first and second frequency representations.

2. The apparatus as set forth in claim 1 wherein:
   the first coupling means includes a tank circuit that is resonant at the second frequency, whereby the first coupling means has a high impedance at the second frequency preventing coupling of the first coupling means when the coil is operating at the second frequency; and
   the second coupling means includes a tank circuit that is resonant at the first frequency to prevent coupling of the second coupling means when the coil is operating at the first frequency.

3. The apparatus as set forth in claim 1 wherein the first coupling means includes an inductive interconnection with the radio frequency coil and the second coupling means is directly connected with the radio frequency coil.

4. The apparatus as set forth in claim 1 wherein at least one of the first and second coupling means includes a 90° phase shift circuit having first and second nodes at either end thereof, the first and second nodes being connected with the birdcage coil at 90° spaced intervals, a first conduction path connects between the first node and a feed point and a second conductive path connects the second node and the feed point, the first and second conductive paths including diodes which are arranged such that electrical communication is established between the feed point and the first node when a radio frequency signal is applied at the feed point and electrical communication is established between the second node and the feed point when signals are received from the birdcage coil, whereby leading and lagging components are reversed on transmit and receive.

5. The apparatus as set forth in claim 1 wherein the radio frequency coil is a birdcage type coil having:
   a plurality of main conductors extending generally parallel to each other arranged with four fold symmetry;
   a first electrical connecting means for interconnecting one end of the main conductors in a ring; and,
   a second electrical connecting means for connecting a second end of the main conductors in a ring.

6. The apparatus as set forth in claim 5 wherein the first coupling means includes an inductive interconnection with the birdcage coil and the second coupling means is directly connected with the birdcage coil.

7. The apparatus as set forth in claim 5 wherein the first coupling means includes first and second inductive couplings coupled with 90° displaced portions of the birdcage coil for quadrature operation as the first frequency.

8. The apparatus as set forth in claim 7 wherein the second coupling means is connected with 90° displaced portions of the birdcage coil for quadrature operation as the second frequency.

9. The apparatus as set forth in claim 8 wherein at least one of the first and second coupling means includes a 90° phase shift circuit having first and second nodes at either end thereof, the first and second nodes being connected with the birdcage coil at 90° spaced intervals, a first conduction path connects between the first node and a feed point and a second conductive path connects the second node and the feed point, the first and second conductive paths including diodes which are arranged such that leading and lagging components at the feed points are reversed on transmit and receive.

10. The apparatus as set forth in claim 9 wherein the diodes are PIN diodes and are arranged such that under a DC bias the first node leads the second node by 90° and absent a DC bias the second node leads the first node by 90°.

11. The apparatus as set forth in claim 5 wherein each of the main conductors include a main conductor tank circuit and wherein the first and second electrical connecting means include a connecting tank circuit connected between each main conductor end.

12. The apparatus as set forth in claim 11 wherein each of the tank circuits include a parallel connected inductance means and capacitance means, one of which is selectively variable such that adjusting the variable one of the inductance and capacitance means of all of the tank circuits adjusts the second resonance frequency of the RF coil.

13. The apparatus as set forth in claim 11 further including PIN diodes connected in series with at least some of the capacitors of the first conducting ring, such that, when DC current is removed from the PIN diodes, the birdcage coil is de-tuned at both the first and second frequencies.

14. The apparatus as set forth in claim 13 wherein the first coupling means includes a $\pi$ circuit having a pair of parallel inductors when connected to each side of one of the PIN diodes and being interconnected by a capacitor, an intersection of one of the inductor and capacitors being connected with a feed point and a 180° balun, the 180° balun being connected with a second $\pi$ circuit having a pair of inductors connected on either side of a second one of the PIN diodes with a capacitor therebetween, whereby a DC current can be removed from the inductors and each of the PIN diodes to de-tune the circuit.

15. The apparatus as set forth in claim 11 further including a first adjusting means for adjusting the capacitance of the capacitors of the connecting means to adjust the first resonant frequency of the RF coil.

16. The apparatus as set forth in claim 15 wherein the first adjusting means includes a tuning ring which is mounted adjacent one of the first and second connecting means and is physically adjustable to adjust concurrently the capacitance of each capacitor of the adjacent conductor means.

17. The apparatus as set forth in claim 15 wherein the tank circuits each include a parallel connected inductor and capacitance means, the capacitance means of the tank circuits being concurrently adjustable for selectively adjusting the second resonant frequency of the RF coil, whereby the first and second RF frequencies are independently adjustable.

18. In a magnetic resonance imaging apparatus in which radio frequency signals are transmitted into an examination region from a birdcage coil tuned to two frequencies, each corresponding to a resonance frequency of a different nuclei in which resonance is to be excited, one of the nuclei requiring higher power than the other, the improvement comprising:

the birdcage coil operating in a high pass mode at the resonance frequency of the frequency requiring higher power and in a low pass mode for the other frequency.

19. In a magnetic resonance scanner in which radio frequency signals of first and second frequencies are provided to a birdcage coil which is concurrently tuned to the first and second frequencies for transmitting the first and second radio frequency energy into an examination region, the improvement comprising:

a direct coupling means for coupling the radio frequency signals of the first frequency to the birdcage coil and an inductive coupling means for coupling the radio frequency signals of the second frequency to the birdcage coil.

20. In a magnetic resonance imager in which radio frequency energy with first and second frequencies from a radio frequency transmitter means is supplied through first and second coupling means to a birdcage coil concurrently tuned to the first and second frequencies for transmitting radio frequency energy of the first and second frequencies into an examination region, the improvement comprising:

a first tank circuit incorporated into the first coupling means for preventing coupling of the first coupling means with the birdcage coil at the second frequency and a second tank circuit incorporated in the second coupling means for preventing the second coupling means from coupling with the birdcage coil at the first frequency, whereby each coupling means is prevented from interfering with the operation of the birdcage coil and from disturbing the symmetry of the birdcage coil when the birdcage coil is operating at the other frequency.

21. In a magnetic resonance imaging apparatus in which a dual mode birdcage radio frequency coil transmits radio frequency signals into an examination region, the improvement comprising:

operating the birdcage coil in quadrature at both the first and second frequency.

22. In a magnetic resonance imaging apparatus in which a birdcage coil is tuned to first and second frequencies for selectively transmitting radio frequency energy into an examination region at either of the first and second frequencies, the improvement comprising:

during a receive portion of a magnetic resonance imaging cycle, the birdcage coil being selectively tunable to any one of (1) the first frequency, (2) the second frequency, and (3) a third mode in which no resonant frequency exists such that the birdcage coil is decoupled from both frequencies, whereby the birdcage coil does not interfere with resonance signals detected by other coils.

* * * * *